United States Patent [19]

McAvoy et al.

[11] 3,942,186

[45] Mar. 2, 1976

[54] HIGH FREQUENCY, FIELD-EFFECT TRANSISTOR

[75] Inventors: Bruce R. McAvoy, Pittsburgh; Michael C. Driver, Trafford, both of Pa.

[73] Assignee: Westinghouse Electric Corporation, Pittsburgh, Pa.

[22] Filed: Mar. 3, 1975

[21] Appl. No.: 554,785

Related U.S. Application Data

[63] Continuation of Ser. No. 404,577, Oct. 9, 1973, abandoned.

[52] U.S. Cl. ................... 357/22; 357/15; 357/68
[51] Int. Cl.² ............ H01L 29/80; H01L 29/48; H01L 23/48
[58] Field of Search ................... 357/15, 22, 68

[56] References Cited
UNITED STATES PATENTS

| | | | |
|---|---|---|---|
| 3,675,313 | 7/1972 | Driver et al. | 357/22 |
| 3,737,743 | 6/1973 | Goronkin et al. | 357/22 |

*Primary Examiner*—Stanley D. Miller, Jr.
*Assistant Examiner*—E. Wojciechowicz
*Attorney, Agent, or Firm*—C. L. Menzemer

[57] ABSTRACT

A high frequency, Schottky barrier gate, field-effect transistor is provided with a substantially constant impedance over a broadband of frequencies. The transistor is comprised of a thin dielectric layer providing an effective dielectric constant at gate and drain contacts greater than $\sqrt{2}$. The dielectric layer is supported on the major surface of a conductor substrate, and is preferably 5 microns in thickness and has a dielectric constant greater than about 5. The transistor is also comprised of a thin semiconductor layer of less than about 2 microns in thickness at least at gate portions with an N-type concentration of between about $5 \times 10^{14}$ and $5 \times 10^{17}$ carriers/cm³. The gate contact of the transistor is an elongated Schottky barrier contact adjoining the semiconductor layer spaced between elongated source and drain contacts which make ohmic contact with the semiconductor layer. Means are also provided to maintain the source contact at substantially the same RF potential as the conductor substrate.

10 Claims, 3 Drawing Figures

U.S. Patent  March 2, 1976  3,942,186
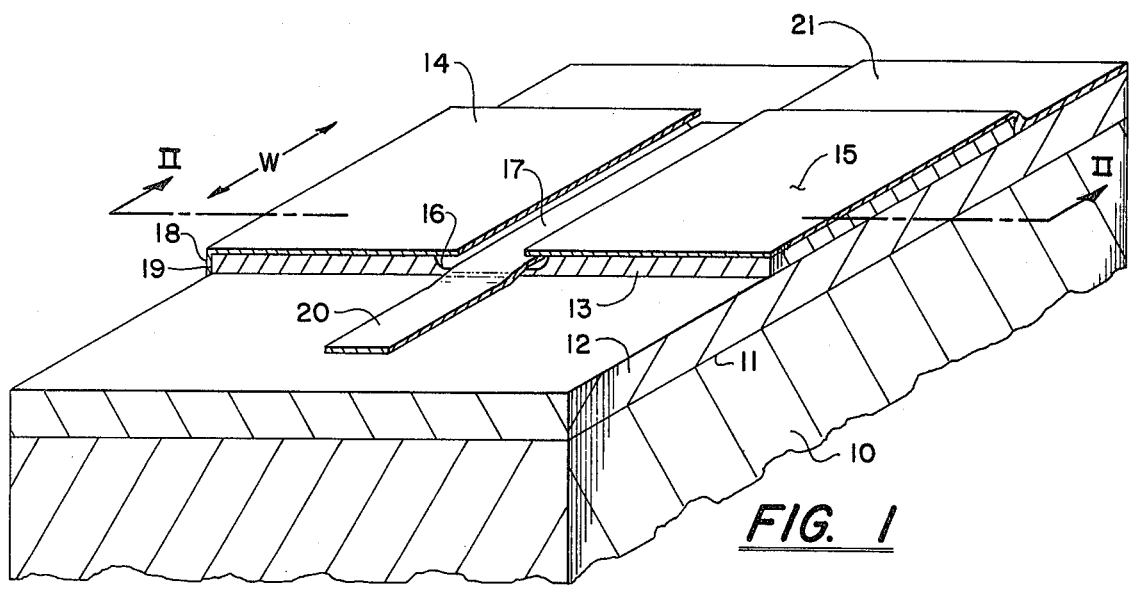
FIG. 1
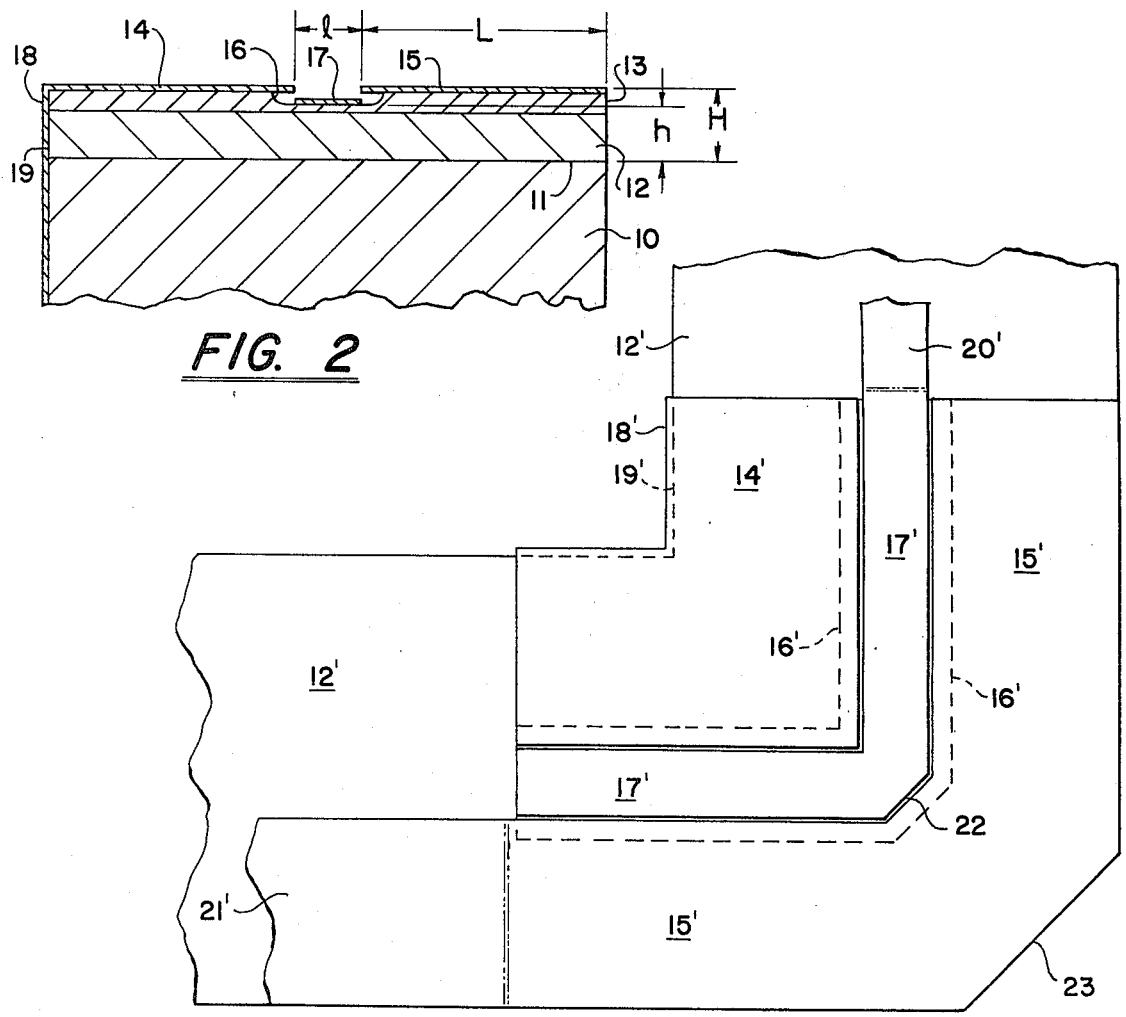
FIG. 2
FIG. 3

HIGH FREQUENCY, FIELD-EFFECT TRANSISTOR

This is a continuation of application Ser. No. 404,577 filed Oct. 9, 1973 and now abandoned.

FIELD OF THE INVENTION

The present invention relates to field-effect transistors and particularly high frequency, Schottky barrier gate, field-effect transistors.

BACKGROUND OF THE INVENTION

Field-effect transistors with high frequency capability, i.e. in the 1 to 20 GHz range, have been known. And the upper frequency and power output capability of RF power transistors has been steadily increasing. Schottky barrier gate, field-effect transistors are particularly compatible with high frequency operation because their geometry and gate response permits minimization of parasitic reactance and impedance. However, these transistors have typically been high-Q, narrow band amplifiers, see U.S. Pat. No. 3,516,021. Broadband operations, i.e. greater than one octave in width, of such transistor have not been made possible without the use of complicated supporting circuitry, see "GHz Amplifiers-How They Are Practical", EDN July 15, 1970, p. 41.

Specifically, broadband capabilities are complicated by device characteristics such as low input resistance, gain-frequency variations, and package parasitics and particularly base lead inductance. Broadbanding of RF power transistors has thus required impedance matching of both input and output, together with provisions for gain-frequency compensation. Input and output transformers have been used to match the impedance of the device to the external circuit impedance, which is generally between 25 and 100 ohms and typically 50 ohms, without power loss. Gain-frequency compensation has been accomplished by (1) the use of frequency selective dissipative matching networks, (2) use of frequency selective load mismatching, and (3) use of frequency selective input mismatching. And lead parasitics have been eliminated by the use of coaxial cables and microstrips, see Electronics Design 1, Jan. 4, 1970, p. 100.

The present invention overcomes these difficulties and complications of the prior devices. It provides a high frequency, Schottky barrier gate, field-effect transistor capable of maintaining a substantially constant impedance over at least an octave of frequency variation. Further, it provides a field-effect transistor which can match the impedance of generally used circuits, i.e. 25 to 100 ohms, and which is readily adaptable for use with microstrip leads.

SUMMARY OF THE INVENTION

A high frequency, Schottky barrier gate, field-effect transistor is comprised of a thin dielectric layer, preferably with a dielectric constant greater than about 5, positioned adjoining and supported on a major surface of a conductor substrate. The conductor is typically a good metal conductor such as copper, gold, silver and platinum, or a highly doped semiconductor such as silicon or gallium arsenide. And the dielectric layer is preferably a single-crystal body, most desirably silicon, gallium arsenide or indium phosphide, or of an insulator material, most desirably quartz or sapphire, on which a semiconductor layer with a high carrier velocity capability can be epitaxially grown. The thickness of the dielectric layer is important to controlling the impedance of the transistor for high frequency, broadband operation, and is less than about 5 microns and typically greater than about 0.2 micron and most desirably greater than about 1 micron.

The transistor is also comprised of a semiconductor layer adjoining the dielectric layer typically epitaxially grown on the dielectric layer by one of the standard techniques. The semiconductor layer used is a semiconductor material such as gallium arsenide, indium phosphide or silicon which has a high carrier velocity, which is needed for high frequency operations. For the same reason, the semiconductor is doped with N-type impurity — electrons being about an order of magnitude greater in carrier velocity than hole carriers — to a concentration between about $5 \times 10^{14}$ and $5 \times 10^{17}$ carriers/cm$^3$. The thickness of the semiconductor layer at the gate portion is also important to controlling the impedance and the high frequency, broadband operation of the device. The thickness is thus less than about 2 microns, typically greater than 0.2 micron and preferably between 0.5 and 1 micron at least at the transistor channel.

Over the semiconductor layer are provided spaced away, elongated source and drain contacts which make ohmic contact to the semiconductor layer. Between the source and drain contacts are provided an elongated Schottky barrier gate contact adjoining the semiconductor layer. Means such as a distributed capacitance shunt is also provided to maintain the source contact at substantially the same RF potential as the conductor substrate.

The impedance and gain-frequency shape of the resulting high frequency transistor is substantially constant over at least one octave and is readily matched to the external circuit impedance. The impedance of the device is controlled by the selection of the dielectric constant for the dielectric layer, the thicknesses of the dielectric and semiconductor layers at the gate contact ($h$) and drain contact (H), and the widths of the gate contact ($l$) and drain contact (L). For balanced input and output impedances, the ratios of $l/h$ and $L/H$ are substantially equal. The ratios of $l/h$ and L/H can also be varied relative to each other to match unbalanced or different input and output impedances and in turn give the transistor added flexibility for circuit design.

It should also be noted that the transistor is not limited to small signal and low power for high frequency, broadband operations. The power handling capacity as well as heat dissipation capacity of the device can be increased simply by increasing the length of the transistor without degradation of high frequency performance. Further, the transistor is preferably linear or reflectively cornered as hereinafter described to avoid impedance discontinuities along the length of the device.

Other details and advantages of the invention will become apparent as the following description of the presently preferred embodiments and present preferred method of practicing the same proceeds.

BRIEF DESCRIPTION OF THE DRAWINGS

In the accompanying drawings, the present preferred embodiments of the invention and the present preferred methods of practicing the invention are illustrated, in which:

FIG. 1 is a perspective view of a high frequency, Schottky barrier gate field-effect transistor embodying the present invention;

FIG. 2 is cross-sectional view taken along line II—II of FIG. 1; and

FIG. 3 is a top view of an alternative high frequency Schottky barrier gate field-effect transistor embodying the present invention.

DESCRIPTION OF THE PREFERRED EMBODIMENTS

Referring to FIGS. 1 and 2, a high frequency, Schottky barrier gate field-effect transistor is shown having high broadband, impedance matching capabilities adapted with microstrip input and output leads. The embodiment is fabricated by utilizing the self-aligning gate method described and claimed in U.S. Pat. No. 3,678,573, granted July 25, 1972 and assigned to the assignee of the present application. Alternatively, self-aligning gate methods described and claimed in U.S. patent applications Ser. No. 317,992, filed Dec. 26, 1972 and Ser. No. 395,319, filed Sept. 7, 1973, both of which are assigned to the assignee of the present application, may be utilized to fabricate similar embodiments without etching of the semiconductor layer. The latter methods are more desirable the higher the frequencies of operation because of the capability to better control the thickness of the semiconductor layer at the channel; however, any of the self-aligning methods are preferred over other fabrication techniques because of transistor geometry of the present invention.

Referring specifically to FIGS. 1 and 2, conductor substrate 10 having preferably planar major surface 11 is provided of a suitable high conductive material such as a metal such as iron, copper, silver, gold or platinum or a highly doped semiconductor such as silicon, gallium arsenide or indium phosphide. Where a semiconductor is used, the substrate is preferably a single-crystal body substantially uniformly doped to between about $1 \times 10^{18}$ and $1 \times 10^{21}$ carriers/cm$^3$. Where metal is used, the major surface 11 of substrate 10 is preferably metalized by standard vapor or sputter deposition techniques with a metal to provide good ohmic and thermal contact between the conductor substrate and the dielectric layer subsequently formed thereon. The composition of such metalization will vary with the composition of the dielectric layer. For example, for a silicon dielectric layer, the metalization is preferably accomplished with chromium-gold, chromium-aluminum or titanium-gold alloy; and for a gallium arsenide or indium phosphide dielectric layer, the metalization is preferably accomplished with gallium-gold, germanium-gold or silver-tin alloy.

Over major surface 11 of conductor substrate 10 is applied thin dielectric layer 12 preferably of less than about 5 microns and of dielectric constant greater than 5. Dielectric layer 12 can be made greater than 5 microns in thickness with material with lower dielectric constants to make suitable for use materials with lower dielectric constants; however, such embodiments are not as good in performance and are considered imperfect embodiments of the invention. However, the dielectric and thickness of the dielectric layer must be selected to provide an effective dielectric constant of at least greater than $\sqrt{2}$. The effective dielectric constant is determined by how much of the electric field of the input and output signals in the subsequently described gate and drain contacts "see" the dielectric, and depends on the composition and thickness of the subsequently described semiconductor layer and the dielectric of the surrounding, as well as the dielectric and thickness of the dielectric layer.

In any case, dielectric layer 12 may be an insulator such as quartz or sapphire or a highly resistive semiconductor layer such as silicon, gallium arsenide or indium phosphide. These materials generally have dielectric constants between 6 and 12, although materials with higher and lower dielectric constants may be used as will occur to one skilled in the art. The composition of the dielectric layer is selected for compatibility with the desired semiconductor layer which is subsequently epitaxially grown on dielectric layer 12. For this reason, the dielectric layer is formed of a single crystal. Where the dielectric layer is composed of an insulator such as quartz or sapphire, the dielectric may be separately formed and applied to major surface 11 by pressure bonding or an adhesive such as an epoxy-silicon compound.

Preferably, however, the dielectric layer is an epitaxially grown semiconductor which is, in some instances, preferably compensation doped. The dopant and the concentration will vary with the composition of the dielectric layer and its thickness. For example, chromium is typically used to compensation dope gallium arsenide or indium phosphide of a concentration of, for example, $1 \times 10^{16}$ atoms/cm$^3$ to make it semi-insulating. Typically intrinsic silicon of an impurity concentration of less than $1 \times 10^{12}$ atoms/cm$^3$ is used to make it high resistive and semiinsulating. Alternatively, the dielectric layer may be formed by proton bombardment of an epitaxially grown semiconductor layer, see IEEE Transactions on Electron Devices, ED-19, No. 5, p. 672 (May, 1972).

Semiconductor layer 13 is applied to adjoin dielectric layer at the area desired for the transistor. Typically, layer 13 is grown by indiscriminate epitaxy to dielectric layer 12 by one of standard techniques, i.e. pyrolysis, evaporation, RF sputtering, or RF discharge, and the layer removed by standard photolithographic and etch techniques from the areas of layer 12 where the transistor is not desired. For example, the growth can be performed using a vapor transport system described in "The Preparation of High Purity Gallium Arsenide by Vapour Phase Epitaxial Growth" by J. R. Knight, D. Effer, and P. R. Evans, Solid-State Electronics, Vol. 8, pp. 178–180 (1965). Alternatively, layer 13 can be grown directly in the limited area desired for the transistor by selective epitaxy as described in Rai-Choudbury and Schroder, J. Electrochem. Soc.: Solid State Science, 118, 107 (1961). Variations of these techniques to epitaxially grow whatever semiconductor that is desired is readily within the knowledge of those skilled in the art.

To provide for high frequency operation, semiconductor layer 13 is preferably composed of gallium arsenide, silicon or indium phosphide to provide high carrier velocity properties in the layer. Further, the semiconductor is doped either during epitaxial growth or by diffusion thereafter with concentrations between about $5 \times 10^{14}$ and $5 \times 10^{17}$ carriers/cm$^3$ and preferably between about $1 \times 10^{15}$ and $1 \times 10^{17}$ carriers/cm$^3$ of N-type impurities such as silicon for gallium arsenide, phosphorus for silicon, and silicon for indium phosphide. In addition, the thickness of the semiconductor layer during the epitaxial growth is usually limited to less than about 4 microns so that the thickness of the semiconductor layer at least at the gate contact is less than about 2 microns, typically greater than 0.20 micron, and preferably between about 0.5 and 1 micron for high frequency operation.

Thereafter, spaced apart, elongated metal contacts 14 and 15 thus are applied to adjoin and make ohmic contact with semiconductor layer 13 and form source and drain contacts, respectively. The contacts are composed of any metal which is relatively resistant to an etchant suitable for etching the semiconductor layer. For example, for silicon, gold, chromium, lead, molybdenum, tungsten or tantalum, with gold preferred; and for gallium arsenide or indium phosphide, gold-germanium and silver-tin with gold-germanium preferred. The contacts are typically formed by vapor depositing a metal layer over the exposed surfaces of layers 12 and 13 and subsequently selectively removing the metal from where it is not desired by standard photolithographic and etching techniques. A suitable etchant for this purpose is an aqueous solution of HCN. In this connection, it is preferred that the vapor deposition be done through an approximating overlaid mask so that the amount of metal which must be removed during etching is reduced. The thickness of contacts 14 and 15 may vary from a minimum of about 300 to 2,000 A or more, with 500 A being the preferred thickness.

The part of the formation of contacts 14 and 15 which is most important is the spacing between the elongated contacts. Such spacing determines the width of the subsequently formed gate contact and is preferably substantially constant along the lengths of the source and drain contacts. The spacing between the source and drain contacts is crucial to a determination of the electrical characteristics of the transistor, and for high frequency operation in the GHz range, is on the order of 2 microns and less. The minimum spacing is limited by the resolution of the photolithographic technique. Therefore, for very small spacings and high resolution, it may be appropriate to use an electroresist and the electron image projection system described in U.S. Pat. Nos. 3,679,497 and 3,710,101, granted July 25, 1972 and Jan. 9, 1973, respectively, both assigned to the assignee of this application, to make the contacts and the spacing between them.

Aperture 16 is then formed in semiconductor layer 13 by etching through the space between contacts 14 and 15 to a depth such that the thickness of the semiconductor layer at the space between the contacts is about one-half the thickness of layer 13. Simultaneously, the etchant undercuts the contacts 14 and 15 adjacent the space therebetween so that the edges of contacts overhand etched portions of the semiconductor layer. Etchants suitable for this purpose will vary with the semiconductor composition. For example, a suitable etchant for this purpose for gallium arsenide or indium phosphide is 50 parts sulfuric acid, 1 part water and 2 parts hydrogen peroxide by volume; a suitable etchant for such purpose for silicon is 1 part nitric acid, 3 parts hydrochloric acid and 4 parts water by volume.

The thickness of the remaining semiconductor layer at aperture 16 is important to the electrical characteristics. For high frequency operation, the semiconductor layer at least at the aperture (where the gate contact is subsequently formed) is of a thickness of less than 2.0 microns, typically greater than 0.2 micron, and preferably between 0.5 and 1.0 micron. The optimum thickness will depend on the impurity concentration which as above stated varies between $5 \times 10^{14}$ and $5 \times 10^{17}$ carriers/cm$^3$. Specifically, the doping concentration and the thickness of the semiconductor layer determines the gate pinch-off voltage. The thinner the semiconductor layer and the lower the doping concentration, the lower the pinch-off voltage of the transistor. A silicon layer of 2 microns in thickness doped to an N-type concentration of $1 \times 10^{15}$ atoms/cm$^3$ has a gate pinch-off voltage of 3.2 volts.

After formation of aperture 16, elongated Schottky barrier gate contact 17 is applied preferably substantially uniform in width along the length, and is automatically aligned by vapor deposition through the space between the overhanging portions of contacts 14 and 15 onto exposed, unshielded portions of semiconductor layer 13 at aperture 16. The metal may also be deposited on contacts 14 and 15 as well as other exposed portions of layers 12 and 13, although preferably the deposition is selectively done through an overlaid mask to reduce the amount of metal which must be subsequently removed by photolithographic and etching techniques. The formed gate contact 17 may have a thickness of from about 300 to 5000 A or more, with about 2000 A being the preferred thickness. To form the Schottky barrier, the metal for gate contact 17 must be selected according to the composition of the semiconductor layer. For example, gold, aluminum, chromium, molybdenum, nickel or platinum are suitable where contact 17 is gallium arsenide and indium phosphide; and gold, chromium, molybdenum, nickel or platinum are suitable where contact 17 is silicon.

Means are also provided for maintaining the conductor substrate 10 and source contact 14 at the same RF potential. Preferably this means is provided by forming layer 18 across side surfaces 19 of layers 12 and 13 during deposition of the source and drain contacts 14 and 15. Layer 18 thus shorts the source contact 14 to the substrate 10. Alternatively, such means may be provided by connecting an external capacitance circuit between substrate 10 and contact 14 or by simply externally grounding substrate 10 and contact to the same reference potential.

Preferably microstrip input and output leads 20 and 21, respectively, are also formed simultaneously with the transistor. Leads 20 and 21 are typically formed by vapor deposition simultaneously with contacts 14 and 15 to make ohmic contact with dielectric layer 12. The length of leads 20 and 21 are adjusted or tapered apart from the widths of drain and gate contacts 15 and 17 to maintain or match an impedance to the external circuit as desired.

A high frequency, broadband transistor is thus provided having an active region equal to the length (W) of source contact 14. The power capability of the device can be adjusted simply by lengthening and shortening the length of the source without compromising the high frequency performance of the device.

The matching of the input and output impedance of the transistor to the external circuit is determined by the width of the gate contact 17 ($l$) and the thickness of dielectric layer 12 plus semiconductor layer 13 at the gate contact ($h$), and by the width of the drain contact 15 (L) and the thickness of the dielectric layer 12 plus semiconductor layer 13 at the drain contact (H)), respectively. Where the input and output impedances are balanced, the dimensions are adjusted so that the ratio of $l/h$ is made substantially equal to the ratio of L/H. On the other hand, where the input and output impedances are desired to be out of balance for some reason of circuit design the dimensions can be adjusted with consideration to the difference in the ratios $l/h$ and $L/H$.

Thus, the input and output impedances of the transistor can be independently matched to the impedance of external circuit by use of the formula:

$$Z_o = \frac{10^4}{3\sqrt{\epsilon}} \left(7 + 8.83 \frac{L'}{H'}\right)$$

where:
- $Z_o$ is the external input or output impedance of the circuit to which the transistor is to be connected at gate contact 17 or drain contact 15;
- $\epsilon$ is the corresponding effective dielectric constant provided by the dielectric layer to an electric field at gate or drain contact, and
- $L'/H'$ is either $L/H$ or $l/h$ for the input or output impedance as above defined.

As shown by FIGS. 1 and 2, the transistor is preferably linear to avoid impedance variations along the length of the device. Where for space requirements or the like, the transistor must be bent, preferably the transistor is reflectively cornered as shown in FIG. 3.

Referring to FIG. 3, the transistor is similar to that described in connection with FIGS. 1 and 2. All the elements are the same and related in the same way except that the device makes a sharp corner along its length. To provide for this cornering, drain contact 15' has angular outside side surface 23 at approximately 45° so that a microwave propagating along the drain contact is reflected off surface 23 at substantially 90° to the axis of incidence. Similarly, gate contact 17' has angular outside side surface 22 so that a microwave propagating along the gate contact is reflected off surface 22 at approximately 90° to the axis of incidence.

While the presently preferred embodiments of the invention and methods for performing them have been specifically described, it is distinctly understood that the invention may be otherwise variously embodied and used.

What is claimed is:

1. A high frequency, Schottky barrier gate field-effect transistor comprised of:
   A. an epitaxial semiconductor layer having an N-type impurity concentration of between about $5 \times 10^{14}$ and $5 \times 10^{17}$ carriers/cm$^3$ and a thickness less than about 2 microns at least at portions adapted to support a gate contact;
   B. elongated source and drain contacts spaced apart adjoining said semiconductor layer and making ohmic contact therewith;
   C. an elongated gate contact spaced between the source and drain contacts and making Schottky barrier contact with the semiconductor layer at said portions adapted to support a gate contact;
   D. a dielectric layer adjoining and supporting said semiconductor layer and having parameters adapted to provide effective dielectric constants at the gate and drain contacts greater than $\sqrt{2}$;
   E. a conductor substrate having a major surface layer adjoining and supporting said dielectric layer; and
   F. means for maintaining the conductor substrate and the source contact at substantially the same RF potential.

2. A high frequency Schottky barrier gate field-effect transistor as set forth in claim 1 wherein:
   the semiconductor layer is composed of a material selected from the group consisting of silicon, gallium arsenide and indium phosphide and is doped to an N-type impurity concentration between about $1 \times 10^{15}$ and $1 \times 10^{17}$ carriers/cm$^3$.

3. A high frequency, Schottky barrier gate field-effect transistor as set forth in claim 1 wherein:
   the gate and drain contacts are substantially constant in widths along their lengths.

4. A high frequency, Schottky barrier gate field-effect transistor as set forth in claim 3 wherein: the ratio of $L/H$ is substantially equal to the ratio $l/h$ where:
   L is the width of the drain contact;
   H is the average thickness of the dielectric layer plus the semiconductor layer at the drain contact;
   $l$ is the width of the gate contact; and $h$ is the average thickness of the dielectric layer plus the semiconductor layer at the gate contact.

5. A high frequency, Schottky barrier gate field-effect transistor as set forth in claim 4 wherein: the ratios $L/H$ and $l/h$ are selected by the equation $$z_o = \frac{10^4}{3\sqrt{\epsilon}} \left(7 + 8.83 \frac{L}{H}\right)$$

where:
- $z_o$ is, respectively, the input and output impedances of a circuit to which the transistor is to be connected at the gate and drain contacts; and
- $\epsilon$ is, respectively, an effective dielectric constant at said active gate or drain contact.

6. A high frequency, Schottky barrier gate field-effect transistor is comprised of:
   A. conductor substrate having a major surface;
   B. a dielectric layer adjoining said major surface and supported by the conductor substrate, said dielectric layer having a thickness less than about 5 microns and a dielectric constant greater than about 5;
   C. an epitaxial semiconductor layer adjoining said dielectric layer, said semiconductor layer having a thickness less than about 2 microns and an N-type impurity concentration of between about $5 \times 10^{14}$ and $5 \times 10^{17}$ carriers/cm$^3$;
   D. elongated source and drain contacts spaced apart adjoining said semiconductor layer and making ohmic contact therewith;
   E. an elongated gate contact spaced between the source and drain contacts and making Schottky barrier contact with the semiconductor layer; and
   F. means for maintaining the conductor substrate and source contact at substantially the same RF potential.

7. A high frequency, Schottky barrier gate field-effect transistor as set forth in claim 6 wherein:
   the semiconductor layer is composed of a material selected from the group consisting of silicon, gallium arsenide and indium phosphide and is doped in an N-type impurity concentration between about $1 \times 10^{15}$ and $1 \times 10^{17}$ carriers/cm$^3$.

8. A high frequency, Schottky barrier gate field-effect transistor as set forth in claim 6 wherein:
   the gate and drain contacts are substantially constant in widths along their lengths.

9. A high frequency, Schottky barrier gate field-effect transistor as set forth in claim 8 wherein: the ratio of $L/H$ is substantially equal to the ratio $l/h$ where:

L is the width of the drain contact;

H is the average thickness of the dielectric layer plus the semiconductor layer at the drain contact;

$l$ is the width of the gate contact; and $h$ is the average thickness of the dielectric layer plus the semiconductor layer at the gate contact.

10. A high frequency, Schottky barrier gate field-effect transistor as set forth in claim 9 wherein: the ratios L/H and $l/h$ are selected by the equation $$z_o = \frac{10^4}{3\sqrt{\epsilon}}\left(7 + 8.83 \frac{L}{H}\right)$$

where:

$z_o$ is the input and output impedances of a circuit to which the transistor is to be connected;

$\epsilon$ is, respectively, an effective dielectric constant at the active gate or drain contact.

* * * * *